US007518393B2

(12) United States Patent
Shirasaki et al.

(10) Patent No.: US 7,518,393 B2
(45) Date of Patent: Apr. 14, 2009

(54) PIXEL CIRCUIT BOARD, PIXEL CIRCUIT BOARD TEST METHOD, PIXEL CIRCUIT, PIXEL CIRCUIT TEST METHOD, AND TEST APPARATUS

(75) Inventors: Tomoyuki Shirasaki, Higashiyamato (JP); Manabu Takei, Sagamihara (JP)

(73) Assignee: Casio Computer Co., Ltd., Tokyo (JP)

( * ) Notice: Subject to any disclaimer, the term of this patent is extended or adjusted under 35 U.S.C. 154(b) by 566 days.

(21) Appl. No.: 11/093,828

(22) Filed: Mar. 29, 2005

(65) Prior Publication Data

US 2005/0219168 A1 Oct. 6, 2005

(30) Foreign Application Priority Data

Mar. 30, 2004 (JP) ............................ 2004-099535

(51) Int. Cl.
*G01R 31/00* (2006.01)

(52) U.S. Cl. ........................................................ 324/770

(58) Field of Classification Search .................. 324/770
See application file for complete search history.

(56) References Cited

U.S. PATENT DOCUMENTS

| | | | |
|---|---|---|---|
| 5,680,149 | A | 10/1997 | Koyama et al. |
| 6,023,259 | A | 2/2000 | Howard et al. |
| 6,091,382 | A | 7/2000 | Shioya et al. |
| 6,166,714 | A | 12/2000 | Kishimoto |
| 6,229,506 | B1 | 5/2001 | Dawson et al. |
| 6,373,454 | B1 | 4/2002 | Knapp et al. |
| 6,377,235 | B1 | 4/2002 | Murade et al. |
| 6,522,315 | B2 | 2/2003 | Ozawa et al. |
| 6,577,302 | B2 | 6/2003 | Hunter et al. |
| 6,650,060 | B2 | 11/2003 | Okuda |
| 6,661,180 | B2 | 12/2003 | Koyama |
| 6,667,580 | B2 | 12/2003 | Kim et al. |
| 6,734,636 | B2 | 5/2004 | Sanford et al. |
| 6,744,414 | B2 | 6/2004 | Lee et al. |
| 6,750,833 | B2 | 6/2004 | Kasai |
| 6,788,003 | B2 | 9/2004 | Inukai et al. |
| 6,859,193 | B1 | 2/2005 | Yumoto |
| 6,900,784 | B2 | 5/2005 | Tsuchida |
| 6,930,680 | B2 | 8/2005 | Miyazawa |
| 6,943,759 | B2 | 9/2005 | Tam |

(Continued)

FOREIGN PATENT DOCUMENTS

| | | | |
|---|---|---|---|
| CN | 1519809 | A | 8/2004 |

(Continued)

OTHER PUBLICATIONS

Japanese Office Action dated Oct. 9, 2007 (and English translation thereof) which was issued in related U.S. Appl. No. 10/489,381.

(Continued)

*Primary Examiner*—Ha Tran T Nguyen
*Assistant Examiner*—Karen M Kusumakar
(74) *Attorney, Agent, or Firm*—Frishauf, Holtz, Goodman & Chick, P.C.

(57) ABSTRACT

A pixel circuit flows a current having a current value corresponding to a test voltage without intervening any display element.

9 Claims, 10 Drawing Sheets

U.S. PATENT DOCUMENTS

| | | | | |
|---|---|---|---|---|
| 6,947,019 | B2 | 9/2005 | Sato et al. | |
| 2001/0017618 | A1 | 8/2001 | Azami | |
| 2001/0035863 | A1 | 11/2001 | Kimura | |
| 2001/0052606 | A1 | 12/2001 | Sempel et al. | |
| 2002/0014852 | A1 | 2/2002 | Bae | |
| 2002/0075208 | A1 | 6/2002 | Bae et al. | |
| 2002/0135309 | A1 | 9/2002 | Okuda | |
| 2002/0163514 | A1 | 11/2002 | Nagai et al. | |
| 2002/0195968 | A1 | 12/2002 | Sanford et al. | |
| 2003/0020335 | A1 | 1/2003 | Komiya | |
| 2003/0098708 | A1 | 5/2003 | Matsueda | |
| 2004/0036664 | A1 | 2/2004 | Miyazawa | |
| 2004/0113873 | A1 | 6/2004 | Shirasaki | |
| 2004/0165003 | A1 | 8/2004 | Shirasaki | |
| 2004/0183791 | A1 | 9/2004 | Yoshida et al. | |
| 2004/0246241 | A1 | 12/2004 | Kazuhito et al. | |
| 2004/0256617 | A1 | 12/2004 | Yamada et al. | |
| 2005/0140610 | A1 | 6/2005 | Smith et al. | |
| 2005/0157581 | A1 | 7/2005 | Shiurasaki et al. | |
| 2005/0183791 | A1 * | 8/2005 | Hidaka et al. | 148/103 |
| 2006/0119552 | A1 | 6/2006 | Yumoto | |
| 2006/0214890 | A1 | 9/2006 | Morishige et al. | |

FOREIGN PATENT DOCUMENTS

| | | | |
|---|---|---|---|
| EP | 10146 501 | A1 | 10/2001 |
| EP | 1 170 718 | A1 | 1/2002 |
| EP | 1 372 136 | A1 | 12/2003 |
| EP | 1 443 483 | A2 | 8/2004 |
| JP | 1-123292 | A | 5/1989 |
| JP | 2506840 | B2 | 4/1996 |
| JP | 8-330600 | A | 12/1996 |
| JP | 11-143429 | A | 5/1999 |
| JP | 2000-221942 | A | 8/2000 |
| JP | 2001-147659 | A | 5/2001 |
| JP | 2002-149125 | A | 5/2002 |
| JP | 2002-215095 | A | 7/2002 |
| JP | 2003-066908 | A | 3/2003 |
| JP | 2003-76327 | A | 3/2003 |
| JP | 2003-1958 | A | 7/2003 |
| JP | 2003-195810 | A | 7/2003 |
| JP | 2003-529805 | A | 10/2003 |
| JP | 2004-021219 | A | 1/2004 |
| KR | 2000-0071301 | A | 11/2000 |
| TW | 331599 | | 5/1998 |
| TW | 582011 | | 4/2004 |
| WO | WO 99/65011 | A2 | 12/1999 |
| WO | WO 01/06484 | A1 | 1/2001 |
| WO | WO 01/20591 | A1 | 3/2001 |
| WO | WO 01/75852 | A1 | 10/2001 |
| WO | WO 02/39420 | A1 | 5/2002 |
| WO | WO 03/058328 | A1 | 7/2003 |
| WO | WO 2004/001714 | A1 | 12/2003 |

OTHER PUBLICATIONS

Japanese Office Action dated Apr. 30, 2008, issued in counterpart Japanese application JP 2004-099535.

Patent Abstracts of Japan, vol. 1998, No. 07, Mar. 31, 1998 and JP 01-123292 A (Matsushita Electric Ind. Co. Ltd.) May 16, 1989—Abstract only.

Japanese Office Action dated Jun. 24, 2008, issued in counterpart Japanese Application No. 2004-009146 of related U.S. Appl. No. 11/035,269.

Japanese Office Action dated Apr. 30, 2008, issued in counterpart Japanese Application No. 2004-099535.

Taiwanese Office Action (and English translation thereof) dated Oct. 28, 2008, issued in a counterpart Taiwanese Application.

* cited by examiner

PIXEL CIRCUIT BOARD, PIXEL CIRCUIT BOARD TEST METHOD, PIXEL CIRCUIT, PIXEL CIRCUIT TEST METHOD, AND TEST APPARATUS

CROSS-REFERENCE TO RELATED APPLICATIONS

This application is based upon and claims the benefit of priority from prior Japanese Patent Application No. 2004-099535, filed Mar. 30, 2004, the entire contents of which are incorporated herein by reference.

BACKGROUND OF THE INVENTION

1. Field of the Invention

The present invention relates to a pixel circuit board usable for an active matrix display panel, a test method of the pixel circuit board, a pixel circuit arranged on the pixel circuit board, a test method of the pixel circuit, and a test apparatus.

2. Description of the Related Art

Organic electroluminescent display panels can roughly be classified into passive driving types and active matrix driving types. Organic electroluminescent display panels of active matrix driving type are more excellent than passive driving types because of high contrast and high resolution. In an organic electroluminescent display panel of active matrix display type described in, e.g., Jpn. Pat. Appln. KOKAI Publication No. 8-330600, an organic electroluminescent element (to be referred to as an organic EL element hereinafter), a driving transistor which supplies a current to the organic EL element when a voltage signal with a voltage value corresponding to image data is applied to the gate, and a switching transistor which performs switching to supply the voltage signal corresponding to image data to the gate of the driving transistor are arranged for each pixel. In this organic electroluminescent display panel, when a scan line is selected, the switching transistor connected thereto is turned on. At this time, a voltage of level representing the luminance is applied to the gate of the driving transistor through a signal line. The driving transistor connected to the signal line is turned on. A driving current having a magnitude corresponding to the level of the gate voltage is supplied from the power supply to the organic EL element through the driving transistor. The organic EL element emits light at a luminance corresponding to the magnitude of the current. During the period from the end of scan line selection to the next scan line selection, the level of the gate voltage of the driving transistor is continuously held even after the switching transistor is turned off. Hence, the organic EL element emits light at a luminance corresponding to the magnitude of the driving current corresponding to the voltage.

The manufacturing process of driving transistors and switching transistors includes a step in which the temperature exceeds the heatresistant temperature of organic EL elements. For this reason, in manufacturing an organic electroluminescent display panel, driving transistors and switching transistors are manufactured before organic EL elements. Preferably, driving transistors and switching transistors are patterned on a substrate to prepare a transistor array board first. Then, organic EL elements are patterned on the transistor array board.

In the above-described transistor array board, it is difficult to determine by a test after manufacture of the organic EL elements whether a failure is caused by a transistor or an organic EL element. In a test before the organic EL elements are manufactured, the transistors are not connected to the organic EL elements. Electrodes (one of the source and drain) of the transistors, which should be connected to the organic EL elements, are electrically independent for each pixel and are in the floating state. In testing the transistors on the transistor array board, the electrodes of the transistors, which should be connected to the organic EL elements, may be probed for each pixel. In this case, the test must be done by inefficiently executing probing for each pixel. The other electrodes (the other of the source and drain) of the transistors, which should be connected to the organic EL elements, are connected to the power supply lines. For this reason, the transistors can be read-accessed from the power supply lines. In this case, the electrodes of the driving transistors, which should be connected to the organic EL elements, must be connected to a constant potential line.

BRIEF SUMMARY OF THE INVENTION

The present invention has been made in consideration of the above-described problems, and has as its advantage to provide a pixel circuit board capable of efficiently testing the characteristics of transistors, a test method of the pixel circuit board, a pixel circuit, a test method of the pixel circuit, and a test apparatus.

In order to solve the above-described problems, according to a first aspect of the present invention, a pixel circuit board comprises:

at least one pixel circuit; and at least one signal line which is connected to the pixel circuit and to which a current having a current value corresponding to a test voltage flows from the pixel circuit without intervening a display element.

According to a second aspect of the present invention, a test method of a pixel circuit board, comprises:

a selection step of selecting a pixel circuit; and a test current step of making a current having a current value corresponding to a test voltage flow from the pixel circuit without intervening a display element.

According to a third aspect of the present invention, a test method of a pixel circuit, comprises:

a test current step of supplying a test current having a current value corresponding to a test voltage from the pixel circuit without intervening a display element.

According to a fourth aspect of the present invention, a test apparatus comprises:

an ammeter which measures a current having a current value corresponding to a test voltage, which flows from a pixel circuit without intervening a display element.

As described above, according to the present invention, it can be determined by the test current supplied from the pixel circuit without intervening the display element whether the pixel circuit is normal.

DETAILED DESCRIPTION OF THE INVENTION

The best mode for carrying out the present invention will be described below with reference to the accompanying drawings. Various kinds of limitations which are technically preferable in carrying out the present invention are added to the embodiments to be described below. However, the spirit and scope of the present invention are not limited to the following embodiments and illustrated examples.

Figure 1:
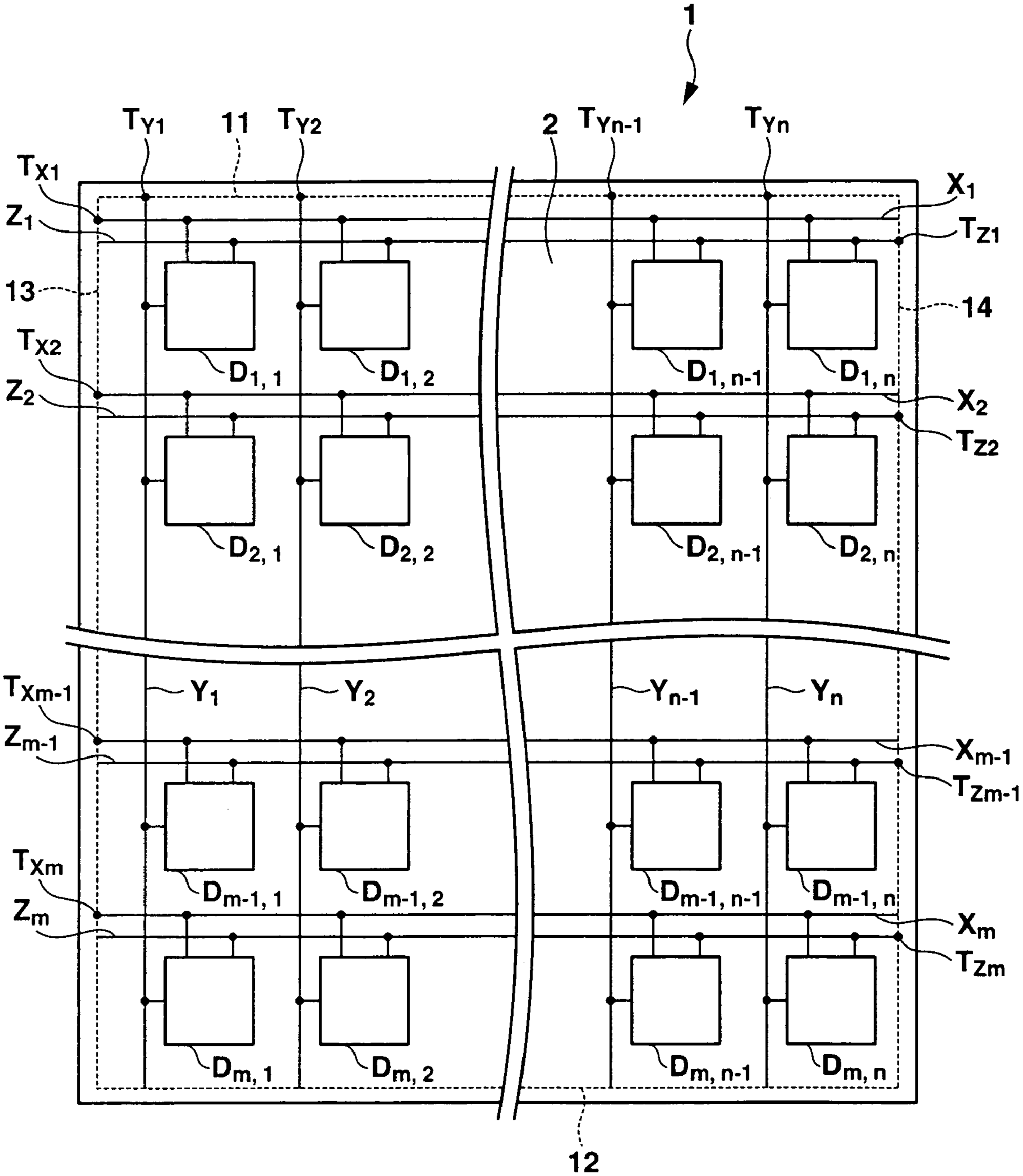
FIG. 1 is an equivalent circuit diagram showing the circuit arrangement of a transistor array board as a test target.

The test target in a test method to which the present invention is applied is a transistor array board 1 serving as a pixel circuit board having a circuit as shown in FIG. 1. This is the transistor array board 1 used for an active matrix electroluminescent display panel. The transistor array board 1 is manufactured by patterning a plurality of transistors on, e.g., on a transparent glass substrate 2 by appropriately executing film formation such as CVD, PVD, or sputtering, masking such as photolithography or metal masking, and patterning such as etching. After the test (to be described later in detail), organic electroluminescent elements each including an anode with a high work function, a cathode with a low work function, and an organic compound phosphor formed between the anode and the cathode are formed in a two-dimensional array on the normal transistor array board 1. With this process, the electroluminescent display panel is manufactured. In manufacturing the electroluminescent display panel, an organic electroluminescent element is provided for each pixel. Instead of patterning one of the anode and cathode for each pixel, one anode or cathode may electrically commonly connected to all pixels. The organic compound phosphor can also be patterned independently for each pixel. Alternatively, some or all of the charge transport layers of the organic compound phosphor, including the hole transport layer, electron transport layer, and light-emitting layer, may continuously be formed for a plurality of pixels.

Figure 5:
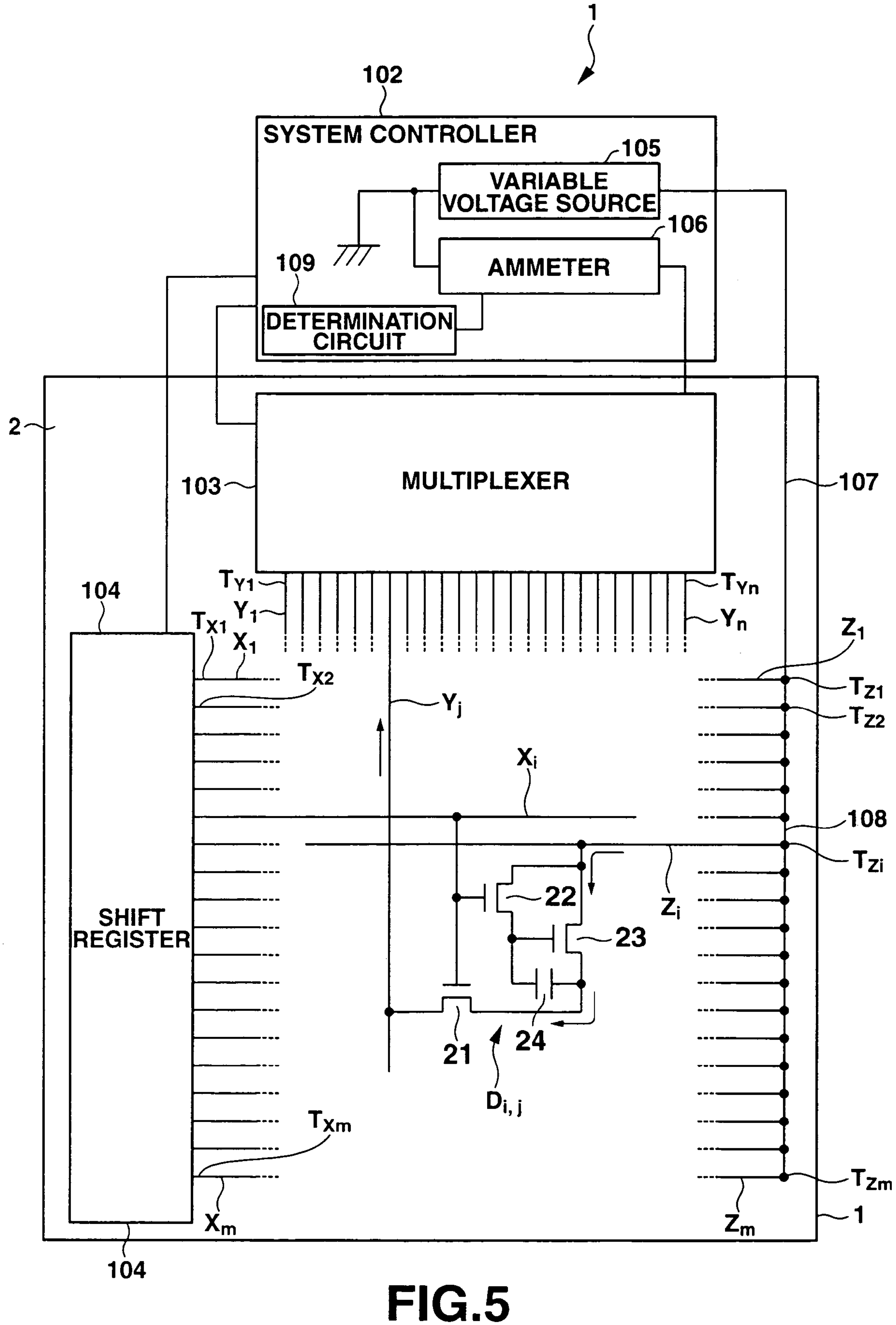
FIG. 5 is a block diagram showing a test apparatus together with the transistor array board.

As will be described later in detail, in the test method of this embodiment, no complex work/process need be executed for the manufactured transistor array board 1. The transistor array board 1 can be tested mainly only by setting the transistor array board 1 in a test apparatus 101 (FIG. 5).

The arrangement of the transistor array board 1 will be described in detail.

As shown in FIG. 1, the transistor array board 1 includes the sheet- or plate-shaped heat-resistant transparent substrate 2 made of, e.g., glass, n signal lines $Y_1$ to $Y_n$ which are arrayed on the substrate 2 to be parallel to each other, m scan lines $X_1$ to $X_m$ which are arrayed on the substrate 2 to be parallel to each other and perpendicular to the signal lines $Y_1$ to $Y_n$ when the substrate 2 is viewed from the upper side, m supply lines $Z_1$ to $Z_m$ each of which is arrayed between the adjacent scan lines on the substrate 2 to be parallel to the scan lines $X_1$ to $X_m$, and (m×n) pixel circuits $D_{1,1}$ to $D_{m,n}$ which are two-dimensionally arrayed on the substrate 2 along the signal lines $Y_1$ to $Y_n$ and scan lines $X_1$ to $X_m$.

In the following description, the direction in which the signal lines $Y_1$ to $Y_n$ extend will be defined as the vertical direction (column direction), and the direction in which the scan lines $X_1$ to $X_m$ run will be defined as the horizontal direction (row direction). In addition, m and n are natural numbers ($m \geqq 2$, $n \geqq 2$). The subscript added to a scan line X represents the sequence from the top in FIG. 1. The subscript added to a supply line Z represents the sequence from the top in FIG. 1. The subscript added to a signal line Y represents the sequence from the left in FIG. 1. The first subscript added to a pixel circuit D represents the sequence from the top, and the second subscript represents the sequence from the left. For example, a scan line $X_i$ is the scan line of the ith row from the top. A supply line $Z_i$ is the supply line of the ith row from the top. A signal line $Y_i$ is the signal line of the jth column from the left. A pixel circuit $D_{i,j}$ is the pixel circuit of the ith row from the top and jth column from the left. In the manufactured electroluminescent display panel, one pixel circuit D is arranged in one pixel.

The signal lines $Y_1$ to $Y_n$ extend from a virtual upper side 11 located on the upper side of the first row of the transistor array board 1 in FIG. 1 to a virtual lower side 12 located on the lower side of the mth row, i.e., the last row. At the virtual upper side 11 of the transistor array board 1, terminals $T_{Y1}$ to $T_{Yn}$ Of the signal lines $Y_1$ to $Y_n$ are exposed from an insulating film which covers the signal lines $Y_1$ to $Y_n$. The scan lines $X_1$ to $X_m$ and supply lines $Z_1$ to $Z_m$ run from a virtual left side 13 located on the left side of the first column of the transistor array board 1 to a virtual right side 14 located on the right side of the nth column, i.e., the last column. At the virtual left side 13 of the transistor array board 1, terminals $T_{X1}$ to $T_{Xm}$ of the scan lines $X_1$ to $X_m$ are exposed from an insulating film which covers the scan lines $X_1$ to $X_m$. At the virtual right side 14 of the transistor array board 1, terminals $T_{Z1}$ to $T_{Zm}$ of the supply lines $Z_1$ to $Z_m$ are exposed from an insulating film which covers the supply lines $Z_1$ to $Z_m$. The signal lines $Y_1$ to $Y_n$ only need to run up to at least one of the virtual upper side 11 and virtual lower side 12. The scan lines $X_1$ to $X_m$ only need to run up to at least one of the virtual left side 13 and virtual right side 14. The supply lines $Z_1$ to $Z_m$ only need to run up to at least the other of the virtual left side 13 and virtual right side 14.

Figure 2:
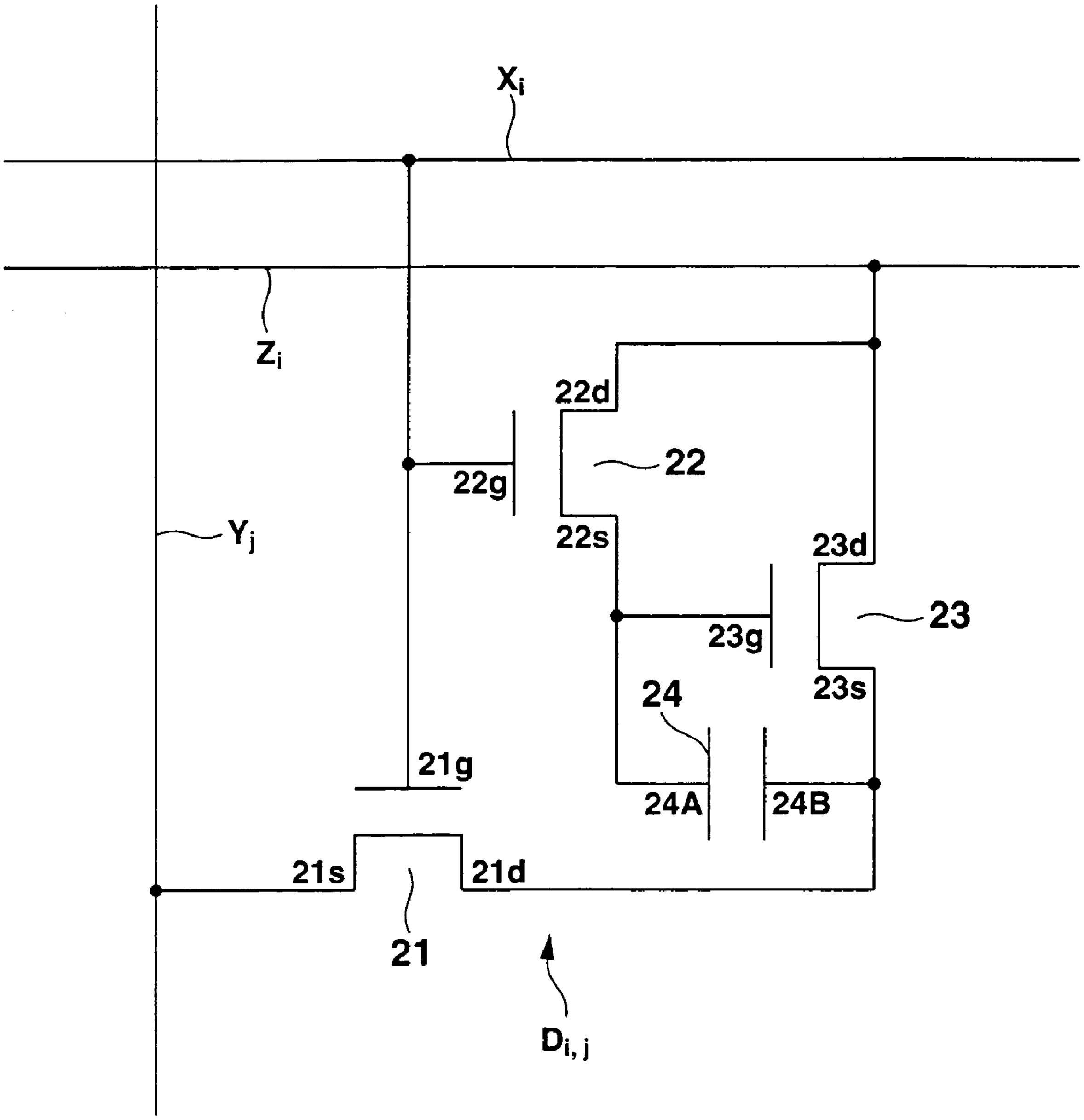
FIG. 2 is an equivalent circuit diagram showing the circuit arrangement of a pixel circuit.
Figure 3:
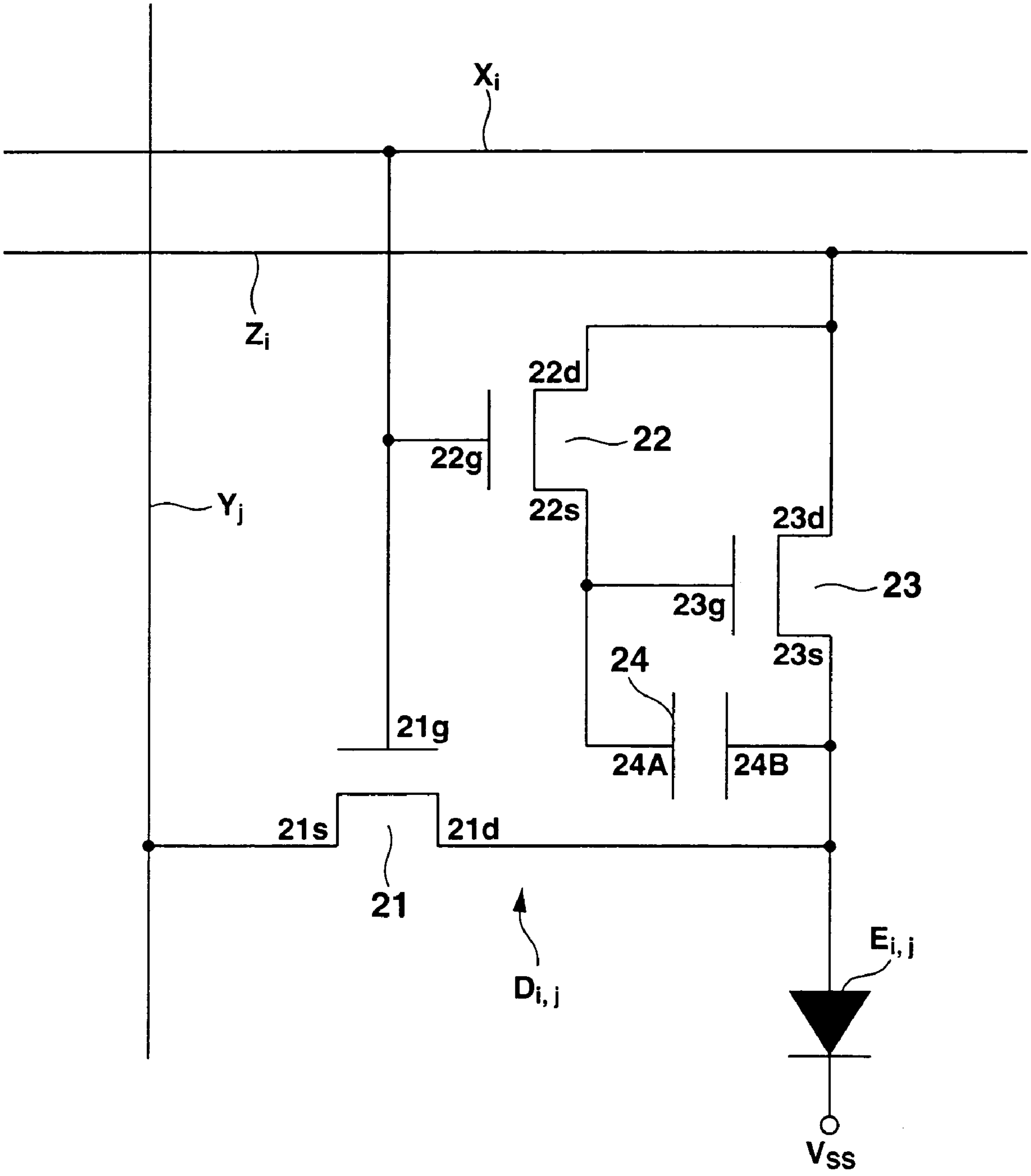
FIG. 3 is an equivalent circuit diagram showing the circuit arrangement when organic EL elements are provided on the transistor array board after the test.
Figure 4:
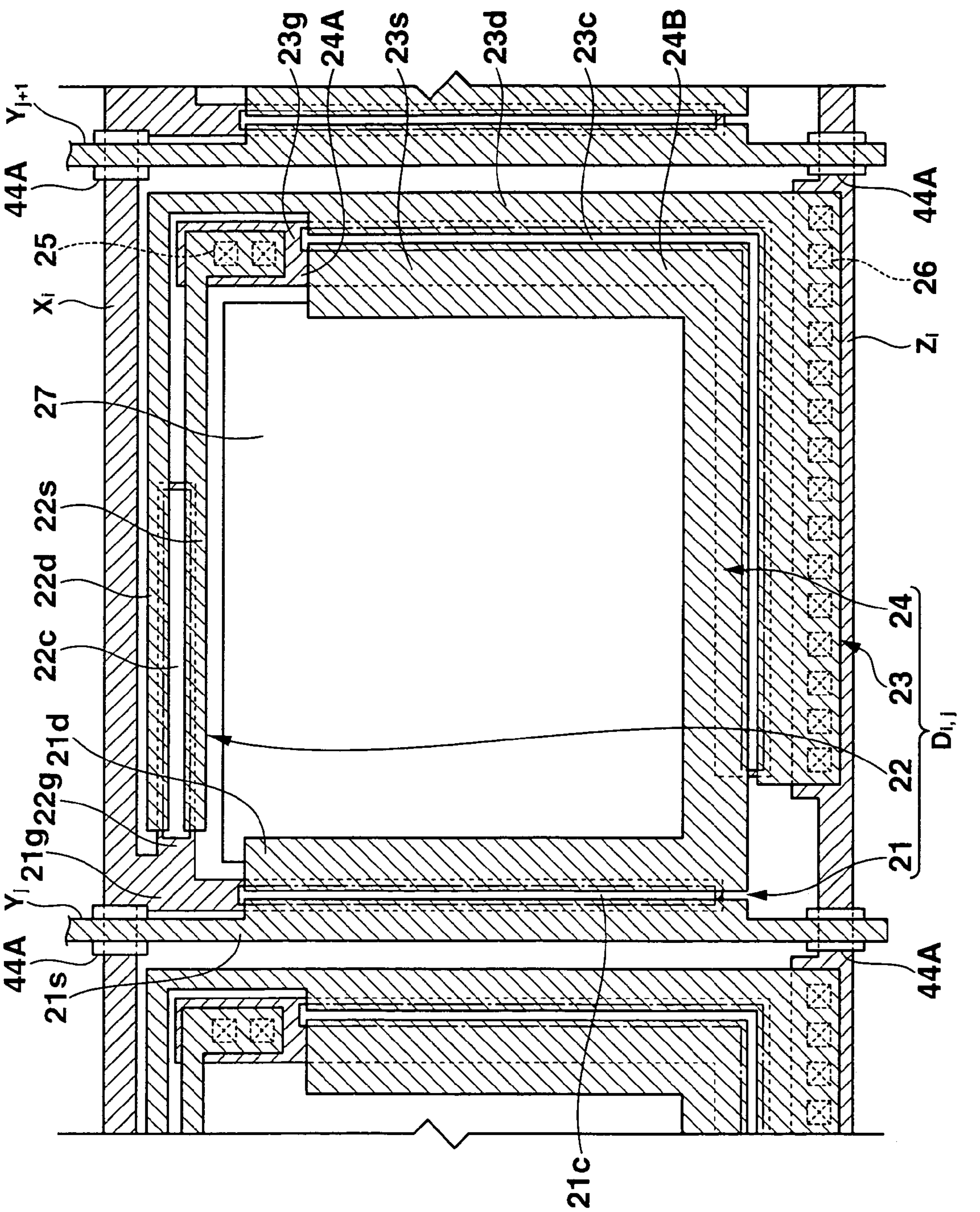
FIG. 4 is a plan view of the pixel circuit.

All the pixel circuits $D_{1,1}$ to $D_{m,n}$ have identical circuit arrangements. Of the pixel circuits $D_{1,1}$ to $D_{m,n}$, the pixel circuit $D_{i,j}$ will representatively be described in FIG. 2. FIG. 2 is an equivalent circuit diagram of the pixel circuit $D_{i,j}$. FIG. 3 is an equivalent circuit diagram showing connection between the pixel circuit $D_{i,j}$ and an organic electroluminescent element $E_{i,j}$ when display elements and, for example, organic electroluminescent elements $E_{1,1}$ to $E_{m,n}$ are provided on the transistor array board 1 which is determined as non-defective by the electrical characteristic test of the pixel circuits $D_{1,1}$ to $D_{m,n}$. FIG. 4 is a schematic plan view mainly showing the structure of the pixel circuit $D_{i,j}$.

The pixel circuit $D_{i,j}$ includes three thin-film transistors (to be simply referred to as transistors hereinafter) 21, 22, and 23 and one capacitor 24. The first transistor 21 serves as a switching element which applies a predetermined voltage to the gate of the third transistor 23 during the selection period in operation at the time of test and after the test to supply a current between the drain and source of the transistor 23, and holds, during the light emission period in operation, the voltage applied to the gate of the transistor 23 during the selection period in operation after the test. The transistor 21 will be referred to as the write transistor 21. The transistor 22 serves as a switching element which electrically connects one of the source and drain of the transistor 23 to the signal line $Y_j$ during the selection period in operation at the time of test and after the test to supply a current from the drain-to-source path of the transistor 23 and disconnects one of the source and drain of the transistor 23 from the signal line $Y_j$ during the light emission period in operation after the test. The transistor 22 will be referred to as the holding transistor 22. The transistor 23 serves as a driving transistor which is connected to the organic electroluminescent element $E_{i,j}$ (to be described later) after the test to supply a current corresponding to the tone to the organic electroluminescent element $E_{i,j}$. The transistor 23 will be referred to as the driving transistor 23. If the test of the pixel circuit $D_{i,j}$ is done to test only the electrical characteristics of the transistors 21 to 23, the capacitor 24 need not be formed until the test. In this case, after the test is ended, the capacitor 24 is formed on only the transistor array board 1 regarded as non-defective.

Each of the first to third transistors 21, 22, and 23 is an n-channel MOS field effect transistor including a gate, a gate insulating film which covers the gate, a semiconductor layer opposing the gate through the gate insulating film, impurity-doped semiconductor layers formed on both ends of the semiconductor layer, a drain formed on one impurity-doped semiconductor layer, and a source formed on the other impurity-doped semiconductor layer. The transistor is particularly an a-Si transistor having a semiconductor layer (channel region) made of amorphous silicon. The transistor may be a p-Si transistor and the semiconductor layer may be made of polysilicon. The transistors 21, 22, and 23 can have either an inverted stagger structure or a coplanar structure.

The transistor array board 1 can be either a bottom emission circuit board or a top emission circuit board. In the bottom emission type, irradiation light from the organic electroluminescent element $E_{i,j}$ is emitted from the lower side of the organic electroluminescent element $E_{i,j}$. In the top emission type, irradiation light from the organic electroluminescent element $E_{i,j}$ is emitted from the upper side of the organic electroluminescent element $E_{i,j}$.

A gate 21*g* of the write transistor 21 is connected to the scan line $X_i$. A source 21*s* is connected to the signal line $Y_j$. A drain 21*d* is connected to a source 23*s* of the driving transistor 23. A gate 22*g* of the holding transistor 22 is connected to the scan line $X_i$. A drain 22*d* is connected to a drain 23*d* of the driving transistor 23 and also to the supply line $Z_i$ through a contact hole 26 (see FIG. 4) formed in the insulating film between the drain 22*d* and the supply line $Z_i$. A source 22*s* of the holding transistor 22 is connected to a gate 23*g* of the driving transistor 23 through a contact hole 25 provided in the insulating film between the source 22*s* and the gate 23*g* of the driving transistor 23. The drain 23*d* of the driving transistor 23 is connected to the supply line $Z_i$ through a contact hole 26. Referring to FIG. 4, a semiconductor layer 21*c* is the semiconductor layer of the write transistor 21. A semiconductor layer 22*c* is the semiconductor layer of the holding transistor 22. A semiconductor layer 23*c* is the semiconductor layer of the driving transistor 23.

When viewed from the upper side, a pixel electrode 27 is formed at the center of the pixel circuit $D_{i,j}$. The pixel electrode 27 is electrically connected to the source 23*s* of the driving transistor 23, the drain 21*d* of the write transistor 21, and one electrode 24B of the capacitor 24. The pixel electrode 27 need not always be provided at the time of test. In the circuit arrangement shown in FIG. 3, the pixel electrode 27 is used as the anode electrode of the organic electroluminescent element $E_{i,j}$ which is formed after the test. In an arrangement in which a current flows from the organic electroluminescent element $E_{i,j}$ to the driving transistor 23, the pixel electrode 27 can be used as a cathode electrode.

The capacitor 24 comprises the other electrode 24A connected to the gate 23*g* of the driving transistor 23, said one electrode 24B connected to the source 23*s* of the transistor 23, and a gate insulating film (dielectric film which is not shown) inserted between the two electrodes. The capacitor 24 has a function of storing charges between the gate 23*g* and source 23*s* of the driving transistor 23.

The transistors 21, 22, and 23 are patterned simultaneously in the same step. The transistors 21, 22, and 23 have the same compositions of the gates, gate insulating films, semiconductor layers, impurity-doped semiconductor layers, drains, and sources. The transistors 21, 22, and 23 have different shapes, sizes, dimensions, channel widths, and channel lengths in accordance with the functions and necessary characteristics of the transistors 21, 22, and 23.

The scan lines $X_1$ to $X_m$ and supply lines $Z_1$ to $Z_m$ are formed simultaneously with the gates 21*g*, 22*g*, and 23*g* and electrode 24A by patterning a conductive thin film (including at least one of a metal layer of chromium, gold, titanium, aluminum, or copper and alloy layers thereof) as prospective gates 21*g*, 22*g*, and 23*g* and electrode 24A by etching. The scan lines $X_1$ to $X_m$, supply lines $Z_1$ to $Z_m$, and gates 21*g*, 22*g*, and 23*g* are covered with a solid gate insulating film. The contact holes 25 and 26 are formed in the gate insulating film (see FIG. 4). The signal lines $Y_1$ to $Y_n$ are formed simultaneously with the sources 21*s*, 22*s*, and 23*s*, drains 21*d*, 22*d*, and 23*d*, and electrode 24B by patterning a conductive thin film (including at least one of a metal layer of chromium, gold, titanium, aluminum, or copper and alloy layers thereof) as prospective sources 21*s*, 22*s*, and 23*s*, drains 21*d*, 22*d*, and 23*d*, and electrode 24B by etching.

When viewed from the upper side in FIG. 4, a protective film 44A is provided between the signal lines $Y_1$ to $Y_n$ and the scan lines $X_1$ to $X_m$ at the points where the signal lines $Y_1$ to $Y_n$ and scan lines $X_1$ to $X_m$ cross and between the signal lines $Y_1$ to $Y_n$ and the supply lines $Z_1$ to $Z_m$ at the points where the signal lines $Y_1$ to $Y_n$ and supply lines $Z_1$ to $Z_m$ cross. The protective film 44A is formed simultaneously with the semiconductor layers 21*c*, 22*c*, and 23*c* by patterning a semiconductor film as prospective semiconductor layers 21*c*, 22*c*, and 23*c*.

On only the transistor array board 1 which is determined as a non-defective by electrical characteristic test of the pixel circuits $D_{1,1}$ to $D_{m,n}$, the organic electroluminescent elements $E_{1,1}$ to $E_{m,n}$ each including the pixel electrode 27, an organic EL layer on the pixel electrode 27, and a counter electrode functioning as the cathode electrode on the organic EL layer are manufactured. In this way, an active matrix electroluminescent display panel is completed. As described above, the pixel electrode 27 is manufactured before the test in advance but may be formed or after the test. The counter electrode can be one electrode common to all pixels. Instead, the counter electrode may be divided into n electrodes for each of the plurality of pixel columns arrayed in the vertical direction or m electrodes for each of the plurality of pixel rows arrayed in the horizontal direction. A reference voltage Vss is applied to the counter electrode.

The test apparatus 101 which tests the transistor array board 1 will be described next with reference to FIG. 5. For the illustrative convenience, only one circuit associated with the ith row and jth column of the transistor array board 1 is shown in FIG. 5.

The transistor array board 1 is detachable from the test apparatus 101. The test apparatus 101 comprises a system controller 102, multiplexer 103, shift register (scan driver) 104, interconnection 107, probe 108, and determination circuit 109.

The probe 108 is a common probe to electrically connect a variable voltage source 105 to all the supply lines $Z_1$ to $Z_m$. The probe 108 is a plate made of a low-resistance conductive substance placed on the terminals $T_{Z1}$ to $T_{Zm}$ of the supply lines $Z_1$ to $Z_m$. The probe 108 is commonly connected to the terminals $T_{Z1}$ to $T_{Zm}$ of the supply lines $Z_1$ to $Z_m$. For this reason, individual probes which are electrically independent need not be aligned and connected to the individual supply lines $Z_1$ to $Z_m$.

The shift register 104 has output terminals equal in number to the terminals $T_{X1}$ to $T_{Xm}$ of the scan lines $X_1$ to $X_m$. When the transistor array board 1 is mounted in the test apparatus 101, the output terminals of the shift register 104 are connected to the terminals $T_{X1}$ to $T_{Xm}$ of the scan lines $X_1$ to $X_m$ in a one-to-one correspondence. The shift register 104 is designed to sequentially output ON-level scan signals from the output terminals while switching them, as shown in the timing chart of FIG. 6. That is, the shift register 104 outputs ON-level scan signals to the scan lines $X_1$ to $X_m$ sequentially in this order (scan line $X_1$ next to the scan line $X_m$), thereby sequentially selecting the scan lines $X_1$ to $X_m$. The period when the shift register 104 is outputting the ON-level scan signal will be referred to as a selection period hereinafter. Each of the selection periods of the scan lines $X_1$ to $X_m$ does not overlap any other selection period.

As shown in FIG. 5, the system controller 102 includes the variable voltage source 105 and ammeter 106. When the transistor array board 1 is mounted in the test apparatus 101, the variable voltage source 105 is electrically connected to the probe 108 through the interconnection 107. The probe 108 is electrically connected to all the supply lines $Z_1$ to $Z_m$.

Figure 6:
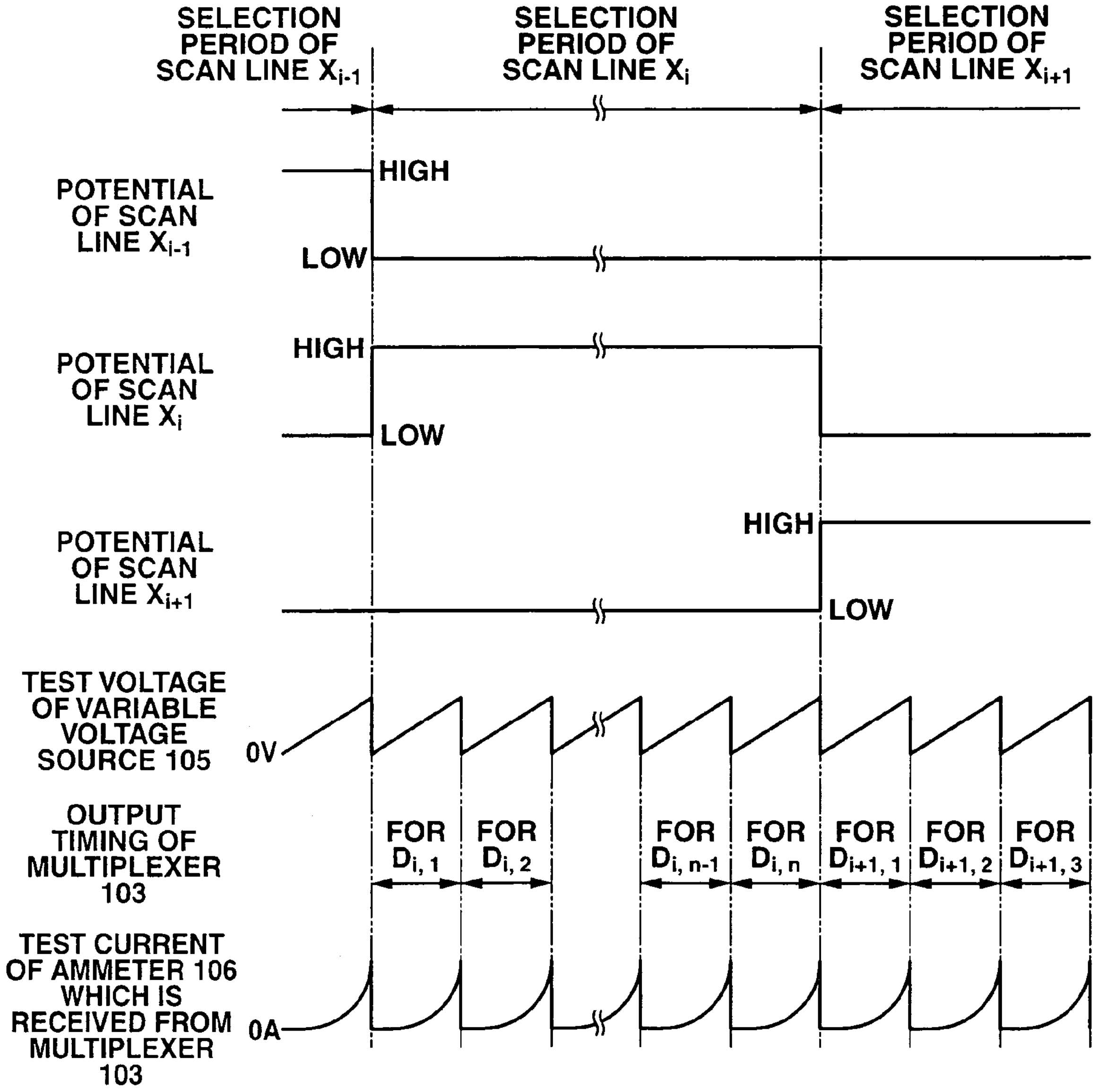
FIG. 6 is a timing chart showing waveforms in the test by the test apparatus.

The variable voltage source 105 applies a test voltage to the supply lines $Z_1$ to $Z_m$ during the selection period of each row. More specifically, as shown in FIG. 6, during the selection period of the scan line $X_i$, the variable voltage source 105 repeatedly applies a linear test voltage through the supply line $Z_i$ to the pixel circuit. The linear test voltage is divided into the number of the pixel circuits $D_{i,1}$ to $D_{i,n}$ and gradually rises. For this reason, the linear test voltage is repeatedly applied to the pixel circuits $D_{i,1}$ to $D_{i,n}$ n times in synchronism. From the start of the selection period of the scan line $X_1$ of the first row to the end of the selection period of the scan line $X_m$ of the mth row by the shift register 104, the test voltage is applied (m×n) times. The variable voltage source 105 may repeatedly apply the test voltage which is higher than 0V first and then gradually decreases to the pixel circuits $D_{i,1}$ to $D_{i,n}$ repeatedly in correspondence with the number of pixel circuits $D_{i,1}$ to $D_{i,n}$.

The multiplexer 103 has input terminals equal in number to the terminals $T_{Y1}$ to $T_{Yn}$ of the signal lines $Y_1$ to $Y_n$, and one output terminal connected to the ammeter 106. When the transistor array board 1 is mounted in the test apparatus 101, the input terminals of the multiplexer 103 and the terminals $T_{Y1}$ to $T_{Yn}$ of the signal lines $Y_1$ to $Y_n$ are connected in a one-to-one correspondence. The multiplexer 103 is designed to sequentially transmit signals input to the input terminals from the output terminal to the ammeter 106 while switching them. That is, the multiplexer 103 outputs the currents flowing to the signal lines $Y_1$ to $Y_n$ to the ammeter 106 sequentially in this order (signal line $Y_1$ next to the signal line $Y_n$) During the selection period of the scan line $X_i$, the variable voltage source 105 outputs the test voltage to the supply line $Z_i$, which is modulated and divided into the number of pixel circuits $D_{i,1}$ to $D_{i,n}$. The multiplexer 103 receives the currents, which flow to the pixel circuits $D_{i,1}$ to $D_{i,n}$ in accordance with the test voltage, through the signal lines $Y_1, Y_2, Y_3, \ldots, Y_{n-1}$ and $Y_n$ in the order of pixel circuits $D_{i,1}, D_{i,2}, D_{i,3}, \ldots, D_{i,n-1}$, and $D_{i,n}$ and outputs the currents to the ammeter 106. The period after the multiplexer 103 outputs the current of the signal line $Y_1$ to the ammeter 106 until the multiplexer 103 outputs the current of the signal line $Y_n$ to the ammeter 106 equals the selection period. The variable voltage source 105 is a circuit which executes this operation n times during the selection period of each of the scan lines $X_1$ to $X_m$ so that the currents, which flow to the pixel circuits $D_{1,1}$ to $D_{m,n}$ in accordance with the modulated test voltage output to the supply lines $Z_1$ to $Z_m$ and whose current values are modulated, are received through the signal lines $Y_1$ to $Y_n$ in the order of $D_{1,1}, D_{1,2}, D_{1,3}, \ldots, D_{m,n-1}$, $D_{m,n}$ and output to the ammeter 106.

The ammeter 106 measures the magnitude of each of the currents which flow to the pixel circuits $D_{1,1}$ to $D_{m,n}$ and are output from the output terminals of the multiplexer 103.

Figure 7:
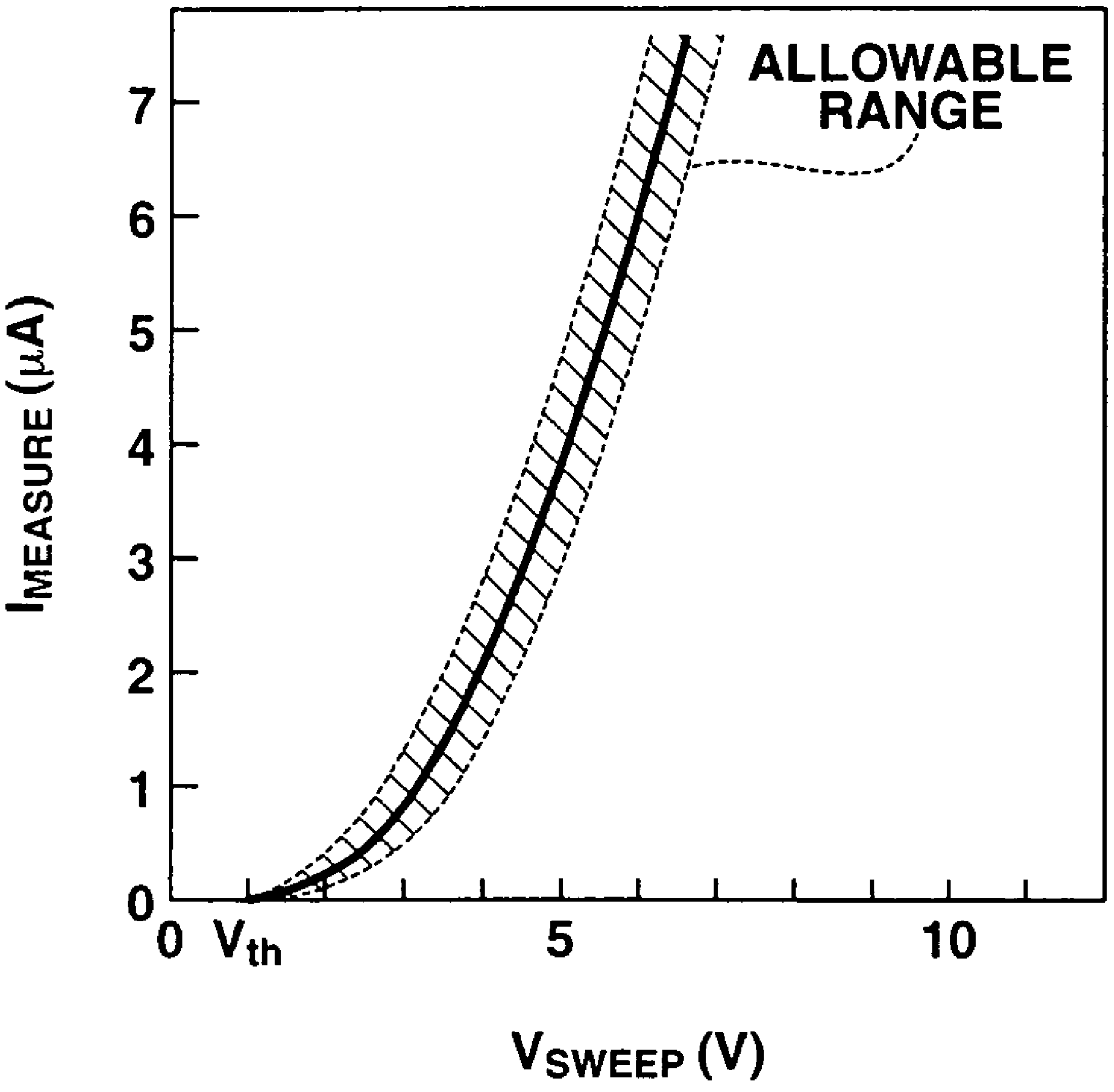
FIG. 7 is a graph showing the relationship between a voltage applied from a variable voltage source and a current measured by an ammeter when the pixel circuit is normal.

The determination or judgment circuit 109 stores the voltage vs. current characteristic data between the source 23*s* and drain 23*d* of the driving transistor 23 of the normal pixel circuit $D_{i,j}$ shown in FIG. 7. The determination circuit 109 has a function of determining, on the basis of the characteristic data and the waveform of the current from the ammeter 106, which is received from the multiplexer 103 in correspondence with the multiple-tone test voltages from the variable voltage source 105 shown in FIG. 6, whether the pixel circuit $D_{i,j}$ as the test target flows a test current having a normal current value for multiple tones. The solid line in FIG. 7 indicates the ideal voltage vs. current characteristic of the driving transistor. The broken line indicates the boundary of the allowable range of the voltage vs. current characteristic of the driving transistor. When the current value of the test current is very small, the test current may be amplified and output to the determination circuit 109.

The operation of the test apparatus 101 and the method of testing the transistor array board 1 and the pixel circuits $D_{1,1}$ to $D_{m,n}$ by using the test apparatus 101 will be described next.

As shown in FIG. 5, the transistor array board 1 is arranged such that the terminals of the shift register 104 are connected to the scan lines $X_1$ to $X_m$. In addition, the transistor array board 1 is arranged such that the terminals of the multiplexer 103 are connected to the signal lines $Y_1$ to $Y_n$. The probe 108 is connected to all the supply lines $Z_1$ to $Z_m$.

As shown in FIG. 6, the shift register 104 then outputs ON-level (high-level) scan signals in the order from the scan line $X_1$ of the first row to the scan line $X_m$ of the mth row (scan line $X_1$ of the first row next to the scan line $X_m$ of the mth row) to sequentially select the scan lines $X_1$ to $X_m$.

During the selection period of each of the scan lines $X_1$ to $X_m$, the variable voltage source 105 supplies the test voltage to be applied to the supply lines $Z_1$ to $Z_m$ n times. During the selection period of each of the scan lines $X_1$ to $X_m$, the multiplexer 103 transmits the test currents from the pixel circuits $D_{k,1}$ to $D_{k,n}$ ($1 \leqq k \leqq m$) sequentially to the ammeter 106 through the signal lines $Y_1$ to $Y_n$. The magnitude of the test current output from the multiplexer 103 is measured by the ammeter 106 in real time.

The operation during the selection period of the scan line $X_1$ of the first row will be described in detail. During the selection period of the scan line $X_1$ of the first row, the ON-level scan signal has been output to the scan line $X_1$. Hence, the write transistor 21 and holding transistor 22 are turned on in all of the pixel circuits $D_{1,1}$ to $D_{m,n}$ of the first row.

When the variable voltage source 105 supplies the test voltage during the selection period of the first row, the voltage between the drain 23*d* and source 23*s* of the driving transistor 23 and the potential between the gate 23*g* and source 23*s* of the driving transistor 23 rise in the pixel circuits $D_{1,1}$ to $D_{m,n}$ as the test voltage of the supply line $Z_1$ of the first row rises. When the increase in potential exceeds the threshold value of the driving transistor 23, the test current starts flowing to the path between the drain 23$d$ and source 23$s$ of the driving transistor 23 and reaches the multiplexer 103, as indicated by the arrow in FIG. 5. When the test voltage further rises beyond the threshold value, the current value of the test current flowing between the drain 23$d$ and source 23$s$ of the driving transistor 23 is also modulated and increases. The multiplexer 103 receives the test current from the pixel circuit $D_{1,1}$ through the signal line $Y_1$ and outputs the test current to the ammeter 106. Next, the multiplexer 103 receives the test current from the pixel circuit $D_{1,2}$ through the signal line $Y_2$ and outputs the test current to the ammeter 106. The multiplexer 103 repeats this operation sequentially until test current from the pixel circuit $D_{1,n}$ is received through the signal line $Y_n$ and outputs to the ammeter 106. The determination circuit 109 determines whether the test voltage applied by the variable voltage source 105 and each of the test currents received in the order of pixel circuits $D_{1,1}$, $D_{1,2}$, $D_{1,3}$, . . . , $D_{1,n-1}$, $D_{1,n}$ and sequentially output from the ammeter 106 have the relationship shown in the graph shown in FIG. 7 and stores whether each of the pixel circuits $D_{1,1}$ to $D_{1,n}$ is normal. That is, to determine whether the current value of the test current output from the pixel circuit $D_{1,j}$ is normal for multiple tones, the voltage value of the test voltage is modulated. In other words, if the current value of the modulated test current flowing to the pixel circuit $D_{1,j}$ for the modulated test voltages of the plurality of tones deviates from the allowable range shown in FIG. 7, the pixel circuit is determined as defective.

More specifically, in determining the test current by the determination circuit 109, if at least one of the write transistor 21, holding transistor 22, driving transistor 23, and the scan line $X_1$, signal line $Y_j$, and supply line $Z_1$ to connect the transistors does not normally function, the transistors 21, 22, and 23 do not normally operate even when the test voltage is normally output from the supply line $Z_1$, and the ON-level scan signal is output from the scan line $X_1$. For this reason, the current value of the test current flowing to the pixel circuit $D_{1,j}$ falls outside the allowable range of the current value, shown in FIG. 7, corresponding to the voltage of the supply line $Z_1$. The determination circuit 109 determines the pixel circuit $D_{1,j}$ as defective. When the current value of the test current flowing to the pixel circuit $D_{1,j}$ falls within the allowable range of the current value, shown in FIG. 7, corresponding to the voltage of the supply line $Z_1$, the determination circuit 109 determines the pixel circuit $D_{1,j}$ as non-defective.

It takes time to flow the test currents with the small current values to the multiplexer 103 because the interconnection capacitances of the signal lines $Y_1$ to $Y_n$ are charged. Each selection period by the shift register 104 at the time of test is much longer than the selection period of each of the scan lines $X_1$ to $X_m$ in displaying on the electroluminescent display panel in which the organic electroluminescent elements $E_{1,1}$ to $E_{m,n}$ are provided on the transistor array board 1. For this reason, in each selection period at the time of test, the test current which reaches the testable current value can be supplied to each of the signal lines $Y_1$ to $Y_n$.

When the shift register 104 sequentially selects the scan lines $X_1$ to $X_m$, the determination circuit 109 determines the current waveform formed by the ammeter 106 in the order from the signal line $Y_1$ to the signal line $Y_n$ for each row. With this operation, the pixel circuits $D_{1,1}$ to $D_{m,n}$ are tested sequentially, and the transistor array board 1 is tested as a whole.

When the determination circuit 109 determines the pixel circuits $D_{1,j}$, $D_{2,j}$, $D_{3,j}$, . . . , $D_{m,j}$ of the same column as defective, the signal line $Y_j$ is suspected to have a problem. When the pixel circuits $D_{i,1}$, $D_{i,2}$, $D_{i,3}$, . . . , $D_{i,n}$ of the same row are determined as abnormal, the scan line $X_i$ and/or supply line $Z_i$ is suspected to have a problem.

As described above, according to this embodiment, no particularly complex work/process need be executed for the transistor array board 1 after it is manufactured. The transistor array board 1 can be tested mainly only by setting the transistor array board 1 in the test apparatus 101 This is because the transistor array board 1 can be operated without forming the organic electroluminescent element for each pixel on the transistor array board 1. More specifically, the driving transistor 23 is connected in series to the write transistor 21 between the supply line $Z_i$ and the signal line $Y_j$. For this reason, when the write transistor 21 and holding transistor 22 are turned on like during the selection period, the test current toward the signal line $Y_j$ can be supplied through the driving transistor 23 and write transistor 21 in accordance with the test voltage output from the supply line $Z_i$. Hence, the transistor array board 1 can be tested without any particularly complex work/process after the manufacture.

When the number of defective pixel circuits of the pixel circuits $D_{1,1}$ to $D_{m,n}$ falls within a predetermined range, the transistor array board 1 is regarded as a non-defective product. The organic electroluminescent elements $E_{1,1}$ to $E_{m,n}$ are manufactured in the display region of the transistor array board 1. When the number of defective pixel circuits falls outside the predetermined range, the transistor array board 1 is regarded as a defective product. No organic electroluminescent elements $E_{1,1}$ to $E_{m,n}$ are manufactured in the display region of the transistor array board 1. In this way, the yield can be increased.

Figure 8:
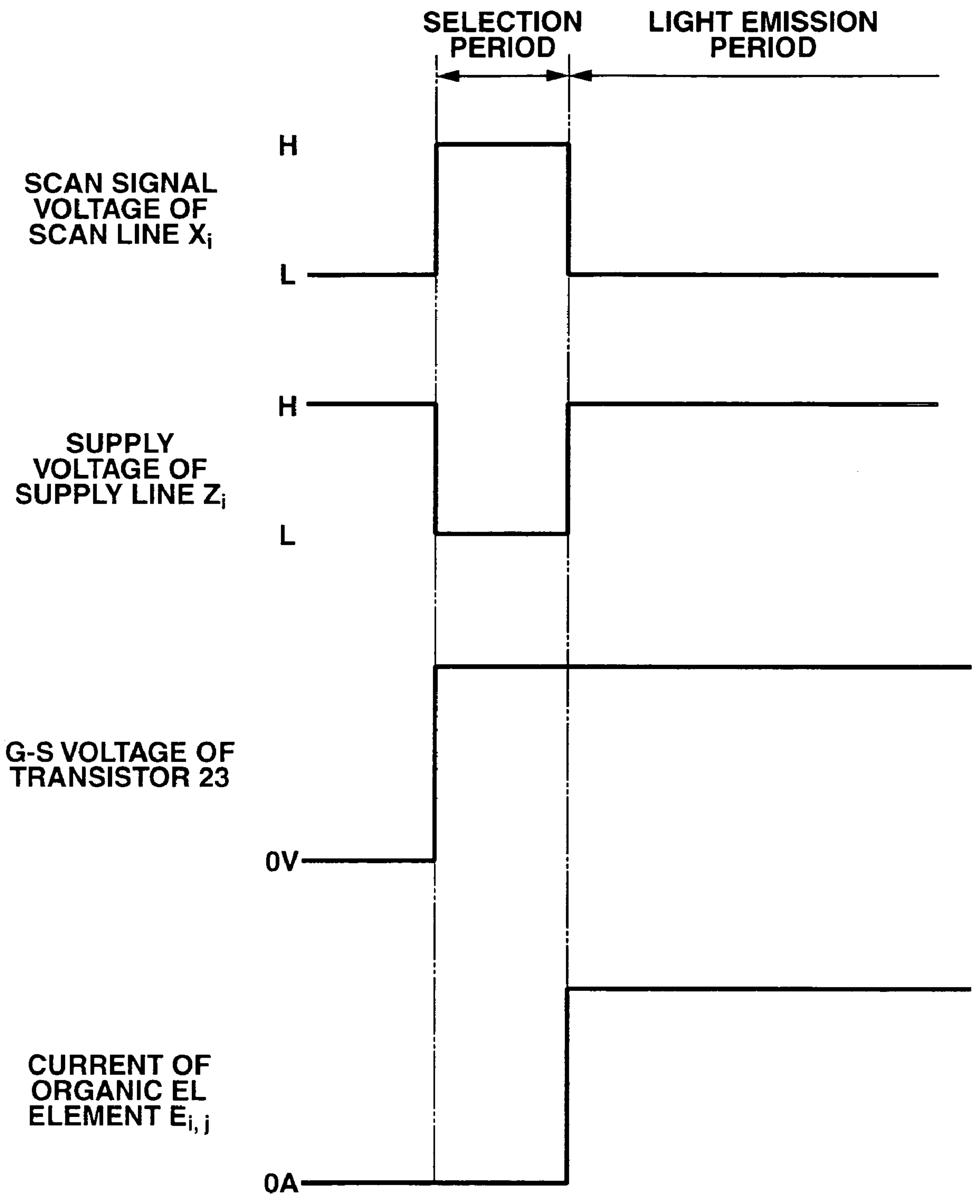
FIG. 8 is a timing chart for explaining the operation of an electroluminescent display panel using the transistor array board.

When an electroluminescent display panel is manufactured by arraying organic electroluminescent elements in a matrix on the transistor array board 1, the electroluminescent display panel can be driven by the active matrix method in the following way. As shown in FIG. 8, when a scan-side driver outputs the ON-level (high-level) scan signal to the scan line $X_i$ of the ith row to select the scan line $X_i$, another scan-side driver outputs a low-level supply voltage from the voltage Vss of the counter electrode of the organic electroluminescent element $E_{i,j}$ to the supply line $Z_i$ of the ith row. The write transistor 21 and holding transistor 22 are turned on. At this time, a pull-out current having a current value corresponding to the tone is supplied by the data-side driver connected to the signal lines $Y_1$ to $Y_n$ to them through the supply line $Z_i$, the driving transistors 23 of the pixel circuits $D_{i,1}$ to $D_{i,n}$, and the write transistors 21 of the pixel circuits $D_{i,1}$ to $D_{i,n}$. The current value of the pull-out current is controlled to a magnitude corresponding to the tone by the data-side driver. At this time, charges having a magnitude corresponding to the level of the voltage between the gate 23$g$ and source 23$s$ of the driving transistor 23 are stored in the capacitor 24. The current value of the pull-out current is converted into the level of the voltage between the gate 23$g$ and source 23$s$ of the driving transistor 23. During the light emission period after that, the scan line $X_i$ is set to low level by the scan-side driver, and the write transistor 21 and holding transistor 22 are turned off. However, the charges are confined in the capacitor 24 by the holding transistor 22 in the OFF state so that the potential difference between the gate 23$g$ and source 23$s$ of the driving transistor 23 is maintained. When the supply line $Z_i$ changes to high level (higher level than the cathode of the organic electroluminescent element $E_{i,j}$), a driving current flows from the supply line $Z_i$ to the organic electroluminescent element $E_{i,j}$ through the driving transistor 23 so that the organic electroluminescent element $E_{i,j}$ emits light. The current value of the driving current depends on the voltage between the gate 23*g* and source 23*s* of the driving transistor 23. For this reason, the current value of the driving current during the light emission period corresponds to the current value of the pull-out current during the selection period.

As described above, in both driving the electroluminescent display panel and testing the transistor array board 1, a current flows from the scan line $X_i$ to the signal line $Y_j$ through the driving transistor 23 and write transistor 21 during the selection period of the ith row. For this reason, as in this embodiment, when the currents flowing to the signal lines $Y_1$ to $Y_n$ during each selection period are measured, the pixel circuits $D_{1,1}$ to $D_{m,n}$ can be tested. Since the defective transistor array board 1 before formation of the organic electroluminescent elements $E_{1,1}$ to $E_{m,n}$ can be removed from the production line to manufacturing the organic electroluminescent elements, the production cost can be suppressed.

The present invention is not limited to the above-described embodiment, and various changes and modifications of the design can be made without departing from the spirit and scope of the present invention.

In the above embodiment, since the multiplexer 103 is arranged, the test currents flowing to the plurality of signal lines $Y_1$ to $Y_n$ are sequentially measured by one common ammeter 106. Instead of using the multiplexer 103, the test currents flowing to the signal lines $Y_1$ to $Y_n$ may be measured simultaneously by connecting an ammeter to each of the signal lines $Y_1$ to $Y_n$. More specifically, in the above embodiment, the ammeter 106 sequentially receives, through the multiplexer 103, the currents flowing to the signal lines $Y_1$ to $Y_n$. However, the currents from the signal lines $Y_1$ to $Y_n$ may simultaneously be received by connecting a plurality of ammeters to the signal lines $Y_1$ to $Y_n$, respectively. In this case, the test voltage needs to be supplied only once during the selection period of each row.

In the above embodiment, the test is done without forming the organic electroluminescent elements $E_{1,1}$ to $E_{m,n}$ on the transistor array board 1. However, the test can also be done after the organic electroluminescent elements $E_{1,1}$ to $E_{m,n}$ are formed on the transistor array board 1. In this case, since whether defective circuits are included in the pixel circuits $D_{1,1}$ to $D_{m,n}$ is unknown before the test, the yield cannot be increased by removing defective circuits from the pixel circuits $D_{1,1}$ to $D_{m,n}$. However, when the test as shown in FIG. 6, which is different from the display operation shown in FIG. 8, is done, the pixel circuits $D_{1,1}$ to $D_{m,n}$ can selectively be tested.

Figure 9:
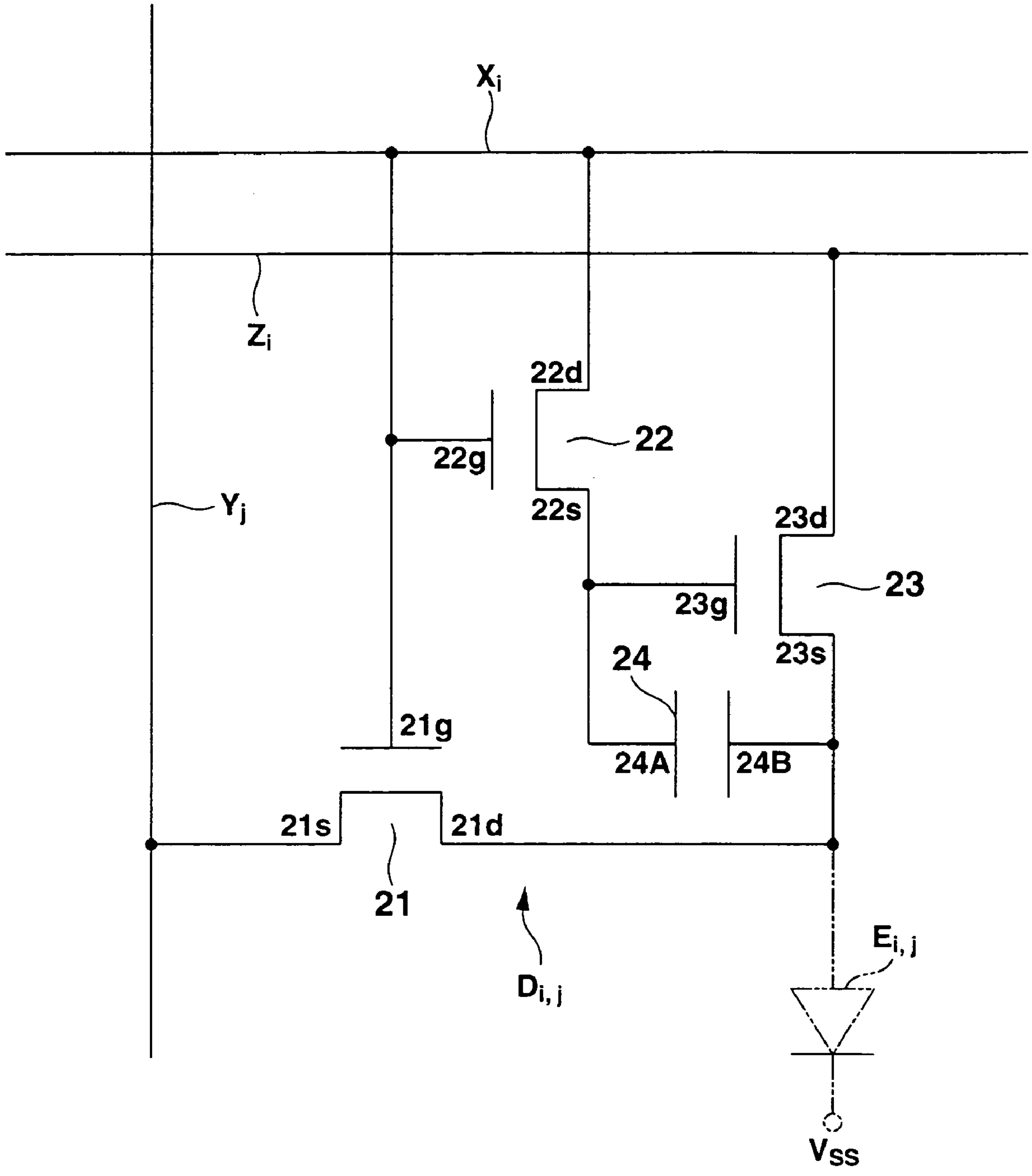
FIG. 9 is an equivalent circuit diagram showing the circuit arrangement of another pixel circuit.

In the above embodiment, the drain of the holding transistor 22 is connected to the supply line $Z_i$. However, as shown in FIG. 9, the drain may be connected to the scan line $X_i$ in place of the supply line $Z_i$.

In the above embodiment, all the transistors of the pixel circuit $D_{i,j}$ are of an n-channel type. However, all the transistors may be of a p-channel type. In this case, the high and low levels of the various signals are inverted. The source and drain of each transistor are connected reversely.

In the above embodiment, the lowest voltage of the variable voltage source 105 is 0V. As shown in FIG. 7, a threshold voltage Vth at which a current starts flowing between the source 23*s* and drain 23*d* of the driving transistor 23 or a voltage close to the threshold voltage may be set as the lowest voltage.

The driving transistor 23 is connected to the pixel electrode 27 of the organic electroluminescent element $E_{i,j}$ in an active matrix electroluminescent display panel after the test. The driving transistor 23 may be connected not to the anode electrode but to the cathode electrode of the organic electroluminescent element $E_{i,j}$.

In the above embodiment, the organic electroluminescent elements are provided not before but after the test. Any other current-tone-controlled light-emitting elements except the organic electroluminescent elements may be provided not before but after the test.

In the above embodiment, the terminals $T_{Y1}$ to $T_{Yn}$ exposed from the insulating film which covers the signal lines $Y_1$ to $Y_n$ are arranged at the virtual upper side 11 of the transistor array board 1. The terminals may be arranged not at the virtual upper side 11 but at the virtual lower side 12 or at both the virtual upper side 11 and virtual lower side 12.

When both terminals of each of the signal lines $Y_1$ to $Y_n$ are exposed from the insulating film at the virtual upper side 11 and virtual lower side 12, one terminal may be connected to the current driver for display driving, and the other terminal may be connected to the multiplexer 103 for the test. Similarly, the terminals $T_{X1}$ to $T_{Xm}$ of the scan lines $X_1$ to $X_m$ may be exposed at the virtual right side 14 of the transistor array board 1 from the insulating film which covers the scan lines $X_1$ to $X_m$. The terminals $T_{Z1}$ to $T_{Zm}$ of the supply lines $Z_1$ to $Z_m$ may be exposed at the virtual left side 13 of the transistor array board 1 from the insulating film which covers the supply lines $Z_1$ to $Z_m$.

In the above embodiment, the signal lines $Y_1$ to $Y_n$ are arranged perpendicularly to the scan lines $X_1$ to $X_m$ and supply lines $Z_1$ to $Z_m$. However, the present invention is not limited to this. The signal lines $Y_1$ to $Y_n$ may be arranged in parallel to the scan lines $X_1$ to $X_m$ or supply lines $Z_1$ to $Z_m$. Similarly, the scan lines $X_1$ to $X_m$ need not always be arranged in parallel to the supply lines $Z_1$ to $Z_m$.

Figure 10:
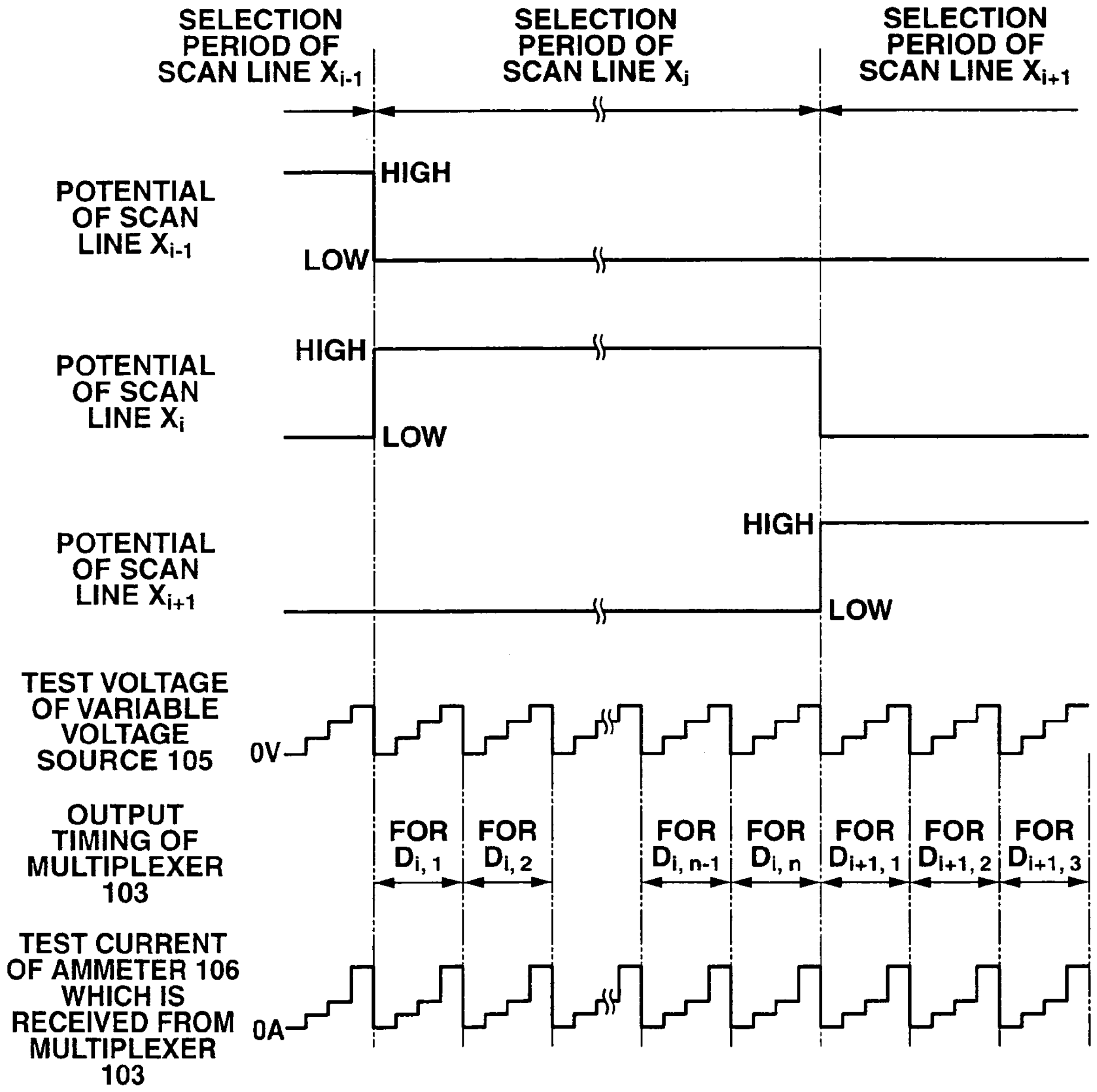
FIG. 10 is a timing chart showing other waveforms in the test by the test apparatus.

In the above embodiment, the modulated voltage output from the variable voltage source 105 is linear for each pixel circuit. Instead, the voltage may be nonlinear. Alternatively, the potential may rise or drop stepwise, as shown in FIG. 10.

In the above embodiment, the variable voltage source 105 outputs a plurality of tone potentials, and the pixel circuits $D_{1,1}$ to $D_{m,n}$ flow currents having current values corresponding to the plurality of tone potentials so that it is determined whether the pixel circuits $D_{1,1}$ to $D_{m,n}$ normally flow the tone currents for multiple tones. Instead, the variable voltage source 105 may output only one tone potential, and the pixel circuits $D_{1,1}$ to $D_{m,n}$ may flow a current having a current value corresponding to the tone potential so that it is determined whether the pixel circuits $D_{1,1}$ to $D_{m,n}$ normally flow a single tone current.

What is claimed is:

1. A pixel circuit board comprising:
at least one pixel circuit;
at least one scan line;
at least one supply line; and
at least one signal line which is connected to the pixel circuit and to which a current having a current value corresponding to a test voltage flows from the pixel circuit without intervening a display element;
wherein the pixel circuit comprises:
a write transistor which has a gate, a drain, and a source, the gate being connected to the scan line, and one of the drain and the source being connected to the signal line;
a holding transistor which has a gate, a drain, and a source, the gate being connected to the scan line, and one of the drain and the source being connected to one of the supply line and the scan line; and
a driving transistor which has a gate, a drain, and a source, the gate being connected to the other of the drain and the source of the holding transistor, one of the drain and the source of the driving transistor being connected to the supply line, and the other of the drain and the source of the driving transistor being connected to the other of the drain and the source of the write transistor.

2. A pixel circuit board according to claim 1, wherein the holding transistor applies a predetermined voltage to the gate of the driving transistor to set a state in which a current flows to a drain-to-source path of the driving transistor during a selection period in operation after a test, and the holding transistor holds, during a light emission period in operation, the voltage applied to the gate of the driving transistor during the selection period in operation after the test.

3. A pixel circuit board according to claim 1, wherein the write transistor electrically connects said other of the source and drain of the driving transistor to the signal line to supply a current from a source-to-drain path of the driving transistor to the signal line during a selection period in operation after a test, and the write transistor disconnects said other of the source and drain of the driving transistor from the signal line during a light emission period in operation after the test.

4. A pixel circuit board according to claim 1, wherein the display element is not provided in a test.

5. A pixel circuit board according to claim 1, wherein the display element is an element which emits light in accordance with the current flowing to the pixel circuit.

6. A test method of a pixel circuit board, comprising:

a selection step of selecting a pixel circuit, by inputting a signal to turn on: a holding transistor which applies a predetermined voltage to a gate of a driving transistor to set a state in which a current flows to a drain-to-source path of the driving transistor, and a write transistor which electrically connects one of a source and a drain of the driving transistor to a signal line to set a state in which a current can be supplied from the source-to-drain path of the driving transistor to the signal line, said signal being inputted to the holding transistor and the write transistor from a scan line connected to holding transistor and the write transistor; and a test current step of applying a predetermined voltage to a supply line connected to the other of the source and the drain of the driving transistor, so that a test current having a current value corresponding to a test voltage flows through the supply line, the drain-to-source path of the driving transistor, the write transistor, and the signal line, without intervening a display element.

7. A pixel circuit board test method according to claim 6, wherein it is determined based on the current flowing to the drain-to-source path of the driving transistor whether the driving transistor, the write transistor, and the holding transistor are normal.

8. A pixel circuit board test method according to claim 6, wherein a plurality of the signal lines , and a plurality of the pixel circuits are provided, the pixel circuits being connected to the signal lines, and each of the pixel circuits having the driving transistor, the write transistor, and the holding transistor; and wherein in the test current step, currents of the plurality of signal lines are sequentially received.

9. A pixel circuit which flows a current having a current value corresponding to a test voltage without intervening a display element;

wherein the pixel circuit comprises:

a write transistor which has a gate, a drain, and a source, the gate being connected to a scan line, and one of the drain and the source being connected to a signal line;

a holding transistor which has a gate, a drain, and a source, the gate being connected to the scan line, and one of the drain and the source being connected to a supply line; and a driving transistor which has a gate, a drain, and a source, the gate being connected to the other of the drain and the source of the holding transistor, one of the drain and the source of the driving transistor being connected to the supply line, and the other of the drain and the source of the driving transistor being connected to the other of the drain and source of the write transistor.

* * * * *